(12) United States Patent
Takeda et al.

(10) Patent No.: US 11,374,693 B2
(45) Date of Patent: Jun. 28, 2022

(54) TERMINAL AND RADIO COMMUNICATION METHOD FOR TRANSMITTING AND RECEIVING UPLINK CONTROL INFORMATION (UCI)

(71) Applicant: NTT DOCOMO, INC., Tokyo (JP)

(72) Inventors: Kazuki Takeda, Tokyo (JP); Tooru Uchino, Tokyo (JP); Satoshi Nagata, Tokyo (JP)

(73) Assignee: NTT DOCOMO, INC., Tokyo (JP)

( * ) Notice: Subject to any disclaimer, the term of this patent is extended or adjusted under 35 U.S.C. 154(b) by 247 days.

(21) Appl. No.: 15/573,742

(22) PCT Filed: May 13, 2016

(86) PCT No.: PCT/JP2016/064300
§ 371 (c)(1),
(2) Date: Nov. 13, 2017

(87) PCT Pub. No.: WO2016/182063
PCT Pub. Date: Nov. 17, 2016

(65) Prior Publication Data
US 2018/0198568 A1     Jul. 12, 2018

(30) Foreign Application Priority Data

May 14, 2015    (JP) .............................. JP2015-099522

(51) Int. Cl.
*H04L 1/18*     (2006.01)
*H04W 72/04*    (2009.01)
(Continued)

(52) U.S. Cl.
CPC .......... *H04L 1/1812* (2013.01); *H03M 13/15* (2013.01); *H04L 5/0051* (2013.01);
(Continued)

(58) Field of Classification Search
CPC ... H04L 1/1812; H04L 5/0055; H04L 5/0051; H04L 1/1861; H04L 5/001; H04W 72/0406; H04W 72/04; H03M 13/15
See application file for complete search history.

(56) References Cited

U.S. PATENT DOCUMENTS 8,897,246 B2     11/2014 Nakao
9,191,162 B2 *   11/2015 Baldemair .............. H04L 1/003
(Continued)

FOREIGN PATENT DOCUMENTS

EP     2690815 A2      1/2014
JP     2014-513462 A   5/2014
(Continued)

OTHER PUBLICATIONS

3GPP TSG RAN WG1 Meeting #80bis R1-151275 Belgrade, Serbia, Apr. 20-24 Agenda Item: 7.2.2.2.2 Source: Huawei, HiSilicon Title: New PUCCH format design to support UCI transmission for up to 32 component carriers (Year: 2015).*

(Continued)

*Primary Examiner* — Ian N Moore
*Assistant Examiner* — Rushil Parimal Sampat
(74) *Attorney, Agent, or Firm* — Osha Bergman Watanabe & Burton LLP

(57) ABSTRACT

A terminal is disclosed that includes a processor that determines a cyclic shift to be applied to a demodulation reference signal, based on a plurality of candidates configured by higher layer signaling and based on a field, for indicating a physical uplink control channel (PUCCH) resource for an uplink control information (UCI), included in a downlink control information. The terminal further includes a transmitter that transmits the UCI using a PUCCH format, in which the determined cyclic shift is applied to the demodulation reference signal and to which an orthogonal code (Continued)

having a sequence length less than 5 is applied, where the processor controls a frequency-domain orthogonal cover code (freq-domain OCC) to be applied for the PUCCH format, and where a number of bits of the UCI is more than 2. In other aspects, a base station and another terminal are also disclosed.

4 Claims, 13 Drawing Sheets

(51) Int. Cl.
    *H04L 5/00*           (2006.01)
    *H03M 13/15*       (2006.01)

(52) U.S. Cl.
    CPC .......... *H04L 5/0055* (2013.01); *H04W 72/04* (2013.01); *H04W 72/0406* (2013.01); *H04L 1/1861* (2013.01); *H04L 5/001* (2013.01)

(56) References Cited

U.S. PATENT DOCUMENTS

| | | | | |
|---|---|---|---|---|
| 9,401,790 | B2 | 7/2016 | Park et al. | |
| 9,686,110 | B2 * | 6/2017 | Park | H04L 27/2613 |
| 10,638,462 | B2 * | 4/2020 | Park | H04L 1/1864 |
| 2012/0113831 | A1 * | 5/2012 | Pelletier | H04L 5/0058 |
| | | | | 370/252 |
| 2013/0136071 | A1 * | 5/2013 | Han | H04L 5/0053 |
| | | | | 370/329 |
| 2013/0294353 | A1 * | 11/2013 | Han | H04W 72/0406 |
| | | | | 370/329 |
| 2015/0029990 | A1 * | 1/2015 | Marinier | H04B 7/0626 |
| | | | | 370/329 |
| 2015/0071195 | A1 * | 3/2015 | Park | H04L 5/0048 |
| | | | | 370/329 |
| 2015/0078304 | A1 * | 3/2015 | Han | H04W 72/0406 |
| | | | | 370/329 |
| 2016/0241377 | A1 | 8/2016 | Takeda et al. | |
| 2017/0013610 | A1 * | 1/2017 | Lee | H04L 1/1861 |
| 2018/0176892 | A1 * | 6/2018 | Kim | H04W 72/0406 |

FOREIGN PATENT DOCUMENTS

| | | |
|---|---|---|
| JP | 2015-70316 A | 4/2015 |
| JP | 2015-511461 A | 4/2015 |
| WO | 2011/145284 A1 | 11/2011 |

OTHER PUBLICATIONS

Extended European Search Report issued in the counterpart European Patent Application No. 16792787.0, dated Apr. 26, 2018 (10 pages).
Alcatel-Lucent, et al.; "PUCCH design for A/N feedbacks on PCell up to 32 carrier aggregation"; 3GPP TSG-RAN WG2 Meeting #80bis, R1-151326; Belgrade, Serbia, Apr. 20-24, 2015 (4 pages).
LG Electronics; "HARQ-ACK PUCCH transmission for Rel-13 CA"; 3GPP TSG RAN WG1 Meeting #80bis, R1-151502; Belgrade, Serbia, Apr. 20-24, 2015 (6 pages).
NTT Docomo, Inc.; "Physical layer design of PUSCH-like new PUCCH format"; 3GPP TSG RAN WG1 Meeting #82bis, R1-155690; Malmö, Sweden, Oct. 5-9, 2015 (8 pages).
International Search Report issued in PCT/JP2016/064300 dated Jul. 26, 2016 (2 pages).
Written Opinion of the International Searching Authority issued in PCT/JP2016/064300 dated Jul. 26, 2016 (4 pages).
Huawei et al.; "New PUCCH format design to support UCI transmission for up to 32 component carriers"; 3GPP TSG RAN WG1 Meeting #80bis, R1-151275; Belgrade, Serbia; Apr. 20-24, 2015 (4 pages).
3GPP TS 36.300 V12.4.0; "3rd Generation Partnership Project; Technical Specification Group Radio Access Network; Evolved Universal Terrestrial Radio Access (E-UTRA) and Evolved Universal Terrestrial Radio Access Network (E-UTRAN); Overall description; Stage 2 (Release 12)"; Dec. 2014 (251 pages).
Extended European Search Report issued in the counterpart European Patent Application No. 18206975.7, dated Mar. 4, 2019 (9 pages).
Office Action issued in the counterpart Japanese Patent Application No. 2015-099522, dated Oct. 25, 2016 (5 pages).
Office Action issued in the counterpart Japanese Patent Application No. 2015-099522, dated Jul. 26, 2016 (9 pages).
Qualcomm Incorporated; "HARQ ACK for up to 32 DL Carriers"; 3GPP TSG RAN WG1 #80bis, R1-151395; Belgrade, Serbia, Apr. 20-24, 2015 (5 pages).

* cited by examiner

| $n_{oc}^{(\tilde{p})}$ | $n_{\tilde{p}}'(n_s)$ | |
|---|---|---|
| | $N_{SF,1}=5$ | $N_{SF,1}=4$ |
| 0 | 0 | 0 |
| 1 | 3 | 3 |
| 2 | 6 | 6 |
| 3 | 8 | 9 |
| 4 | 10 | N/A |

FIG. 5

| Cyclic Shift Field in uplink-relate DCI format | $n^{(2)}_{DMRS,\lambda}$ | | | | $[w^{(\lambda)}(0)\ w^{(\lambda)}(1)]$ | | | |
|---|---|---|---|---|---|---|---|---|
| | $\lambda=0$ | $\lambda=1$ | $\lambda=2$ | $\lambda=3$ | $\lambda=0$ | $\lambda=1$ | $\lambda=2$ | $\lambda=3$ |
| 000 | 0 | 6 | 3 | 9 | [1 1] | [1 1] | [1 1] | [1 -1] |
| 001 | 6 | 0 | 9 | 3 | [1 -1] | [1 -1] | [1 -1] | [1 1] |
| 010 | 3 | 9 | 6 | 0 | [1 -1] | [1 -1] | [1 -1] | [1 1] |
| 011 | 4 | 10 | 7 | 1 | [1 1] | [1 1] | [1 1] | [1 1] |
| 100 | 2 | 8 | 5 | 11 | [1 1] | [1 1] | [1 1] | [1 1] |
| 101 | 8 | 2 | 11 | 5 | [1 -1] | [1 -1] | [1 -1] | [1 -1] |
| 110 | 10 | 4 | 1 | 7 | [1 -1] | [1 -1] | [1 -1] | [1 -1] |
| 111 | 9 | 3 | 0 | 6 | [1 1] | [1 1] | [1 1] | [1 -1] |

$\lambda$: ANTENNA PORT FOR TRANSMITTING PUCCH

FIG. 8

TERMINAL AND RADIO COMMUNICATION METHOD FOR TRANSMITTING AND RECEIVING UPLINK CONTROL INFORMATION (UCI)

TECHNICAL FIELD

The present invention relates to a user terminal, a radio base station and a radio communication method in next-generation mobile communication systems.

BACKGROUND ART

In the UMTS (Universal Mobile Telecommunications System) network, the specifications of long term evolution (LTE) have been drafted for the purpose of further increasing high speed data rates, providing lower delays and so on (see non-patent literature 1). This is the specification of LTE 10-12.

The system band in LTE Rel. 10 to 12 includes at least one component carrier (CC), where the LTE system band constitutes one unit. Such bundling of a plurality of CCs into a wide band is referred to as "carrier aggregation" (CA).

In LTE of Rel. 8 to 12, the specifications have been drafted assuming exclusive operations in frequency bands that are licensed to operators—that is, licensed bands. For licensed bands, for example, 800 MHz, 2 GHz and/or 1.7 GHz have been in use.

In LTE of Rel. 13 and later versions, operation in frequency bands where license is not required—that is, unlicensed bands—is also a target of study. For unlicensed band, for example, 2.4 GHz, which is the same as in Wi-Fi, or the 5 GHz band and/or the like may be used. Although carrier aggregation (LAA: license-assisted access) between licensed bands and unlicensed bands is placed under study in Rel. 13 LTE, there is a possibility that, in the future, dual connectivity and unlicensed-band stand-alone will becomes targets of study as well.

CITATION LIST

Non-Patent Literature

Non-Patent Literature 1: 3GPP TS 36.300 "Evolved Universal Terrestrial Radio Access (E-UTRA) and Evolved Universal Terrestrial Radio Access Network (E-UTRAN); Overall Description; Stage 2"

SUMMARY OF INVENTION

Technical Problem

In CA in the above-mentioned successor systems of LTE (LTE Rel. 10 to 12), the maximum number of CCs that can be configured per user terminal (UE) is limited to five. In and after LTE Rel. 13, which is an even more advanced successor system of LTE, a study is in progress to reduce the limit on the number of CCs that can be configured per UE and configure six or more CCs, in order to make possible even more flexible and faster wireless communication.

However, when the number of CCs that can be configured in a user terminal is expanded to six or more (for example, 32), it becomes difficult to use the transmission methods of existing systems (Rel. 10 to 12) on an as-is basis. For example, in existing systems, uplink control signals (UCI) such as delivery acknowledgment signals (HARQ-ACKs) for each CC's DL signals are transmitted on an uplink control channel (PUCCH Physical Uplink Control CHannel). In this case, the user terminal transmits uplink control signals by applying a PUCCH format that presupposes five or fewer CCs. On the other hand, when the user terminal transmits uplink control signals for six or more CCs, it is assumed that a new transmission method is required in order to properly transmit the uplink control signals.

The present invention has been made in view of the above, and it is therefore an object of the present invention to provide a user terminal, a radio base station and a radio communication method, whereby uplink control signals can be transmitted adequately even when the number of component carriers that can be configured in a user terminal is expanded.

Solution to Problem

One aspect of the user terminal of the present invention, a user terminal has a receiving section that receives a DL signal, a transmission section that transmits UL control information, which includes a delivery acknowledgement signal in response to the DL signal, and a control section that controls the transmission of the UL control information, and, in this user terminal, the control section controls the transmission of the UL control information by using a PUCCH format, in which a cyclic shift is applied to a first symbol for a demodulation reference signal, and in which the orthogonal code is not applied, or an orthogonal code having a shorter sequence length than the sequence length adopted in existing PUCCH format 3 is applied, to a second symbol.

Advantageous Effects of Invention

According to the present invention, it is possible to transmit uplink control signals adequately even when the number of component carriers that can be configured in a user terminal is expanded.

BRIEF DESCRIPTION OF DRAWINGS

FIG. 5 is a diagram to show an example of a table for use for determining DMRS cyclic shifts in a new PUCCH format;

FIG. 8 is a diagram to show an example of a table for use for determining DMRS cyclic shifts and orthogonal codes in a new PUCCH format;

DESCRIPTION OF EMBODIMENTS

Figure 1:
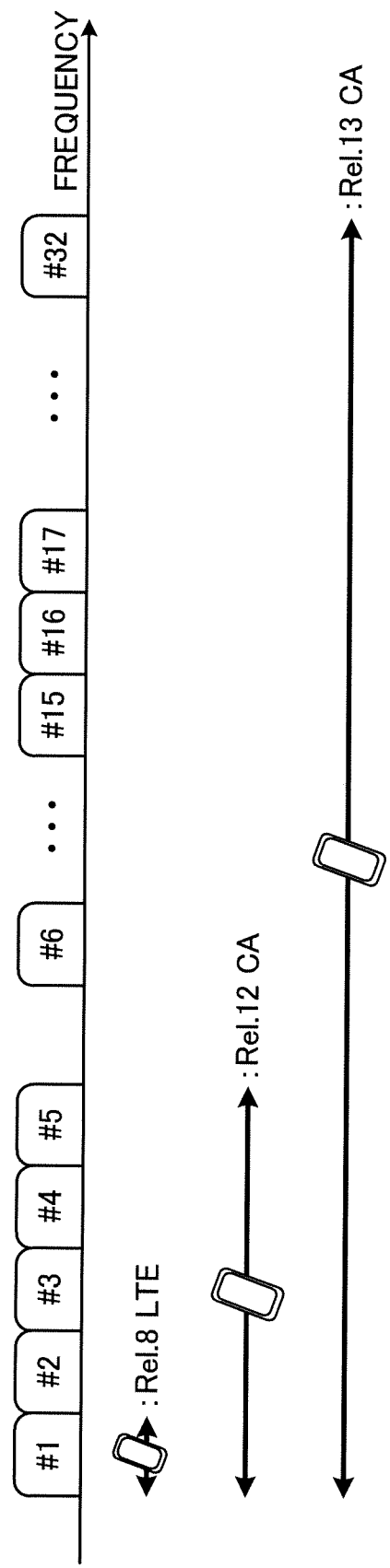
FIG. 1 is a diagram to explain component carriers in carrier aggregation being studied under LTE Rel. 13.

FIG. 1 is a diagram to explain carrier aggregation (CA). As shown in FIG. 1, in CA of up to LTE Rel. 12, maximum five component carriers (CCs) (CC #1 to CC #5) are bundled, where the system band of LTE Rel. 8 constitutes one unit. That is, in carrier aggregation up to LTE Rel. 12, the number of CCs that can be configured in a user terminal (UE: User Equipment) is limited to maximum five (one primary cell and maximum four secondary cells).

Meanwhile, in carrier aggregation of LTE Rel. 13, a study is in progress to further expand the band by bundling six or more CCs. That is, in carrier aggregation of LTE Rel. 13, expansion of the number of CCs (cells) that can be configured per user terminal to 6 or more (CA enhancement) is being studied. For example, as shown in FIG. 1, when 32 CCs (CC #1 to CC #32) are bundled, a bandwidth of maximum 640 MHz can be secured.

In this way, more flexible and faster radio communication is expected to be made possible by increasing the number of CCs that can be configured in a user terminal. Also, expanding the number of CCs like this is an effective way to widen the band in carrier aggregation (LAA: License-Assisted Access) between licensed bands and unlicensed bands. For example, when five licensed band CCs (=100 MHz) and fifteen unlicensed band CCs (=300 MHz) are bundled, a bandwidth of 400 MHz can be secured.

For unlicensed bands in which LAA is run, a study is in progress to introduce interference control functionality in order to allow co-presence with other operators' LTE, Wi-Fi or different systems. LBT (Listen Before Talk), which is based on CCA (Clear Channel Assessment), is under study to provide an interference cancellation function. Therefore, a cell (CC) to use an unlicensed band can also be a cell to which listening (LBT, etc.) is applied.

Meanwhile, when the number of CCs that can be configured in a user terminal is expanded to six or more (for example, 32), it is difficult to directly apply the transmission methods used in existing systems (Rel. 10 to 12) (for example, PUCCH formats) on an as-is basis.

For example, in existing systems (Rel. 10 to 12), uplink control signals such as delivery acknowledgment signals (HARQ-ACKs) for DL data (PDSCH) transmitted in each CC are transmitted in an uplink control channel (PUCCH). In this case, the user terminal transmits uplink control signals by applying a PUCCH format that presumes five or fewer CCs (for example, PUCCH format 1/1a, 1b, 3 or 1b with channel selection).

Figure 2:
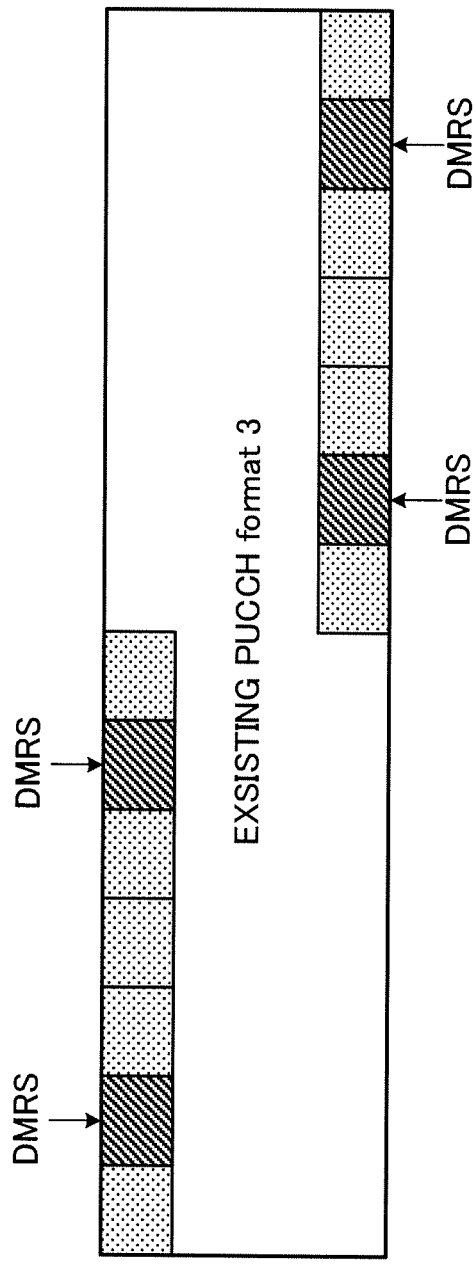
FIG. 2 is a diagram to show an example of a PUCCH format in which non-DMRS symbols are not spread in PUCCH format 3/PUSCH.

For example, PUCCH format 3, which can transmit a large amount of uplink control information (for example, HARQ-ACKs) among existing PUCCH formats, supports 10 bits in FDD and supports up to 21 bits in TDD. FIG. 2 shows the configuration of existing PUCCH format 3. In PUCCH format 3, each slot is comprised of two demodulation reference signals (DMRSs) and five SC-FDMA (Single Carrier Frequency Divisional Multiple Access) symbols. Although the same bit sequence is mapped to each SC-FDMA symbol in a slot, the SC-FDMA symbols are multiplied by spreading codes (also referred to as "orthogonal code," "OCCs," etc.) so that a plurality of user terminals can be multiplexed.

Also, cyclic shifts (hereinafter also referred to as "CSs") that vary between user terminals are applied to the DMRSs in each slot. By applying orthogonal codes and cyclic shifts, it is possible to code-division-multiplex (CDM) up to five PUCCH formats 3 on the same resource (PRB). For example, it is possible to orthogonal-multiplex HARQ bit sequences using different OCC sequences per user terminal, and orthogonal-multiplex DMRSs by using different CS sequences per user.

However, if the user terminal transmits 6 or more CCs (for example, 32 CCs) of plink control signals, it is expected that a PUCCH format to support 64 to 256 bits is required. For example, in FDD, 64 bits are used when two codewords of HARQ-ACKs (two transport blocks) are transmitted for each of 32 CCs.

Also, in TDD, which DL subframes (including special subframes) correspond to one UL subframe is stipulated, depending on the UL/DL configuration to be applied. That is, in TDD, there are cases where, in 1 CC, HARQ-ACKs in response to DL signals of a plurality of DL subframes (for example, four subframes) are transmitted in one UL subframe. For example, in TDD, if two codewords of HARQ-ACKs (two transport blocks) are transmitted for each of 32 CCs and four DL subframes correspond to one UL subframe, 256 bits are required (128 bits if spatial bundling is applied).

Therefore, if the user terminal uses an existing PUCCH format, on an as-is basis, when transmitting uplink control signals for 6 or more CCs (for example, 32 CCs), the payload (capacity) of the PUCCH becomes insufficient, and there is a risk that communication cannot be performed properly. So, in order to transmit uplink control signals for 6 or more CCs (for example, 32 CCs), the present inventors have come up with the idea of uplink control transmission using a new PUCCH format that can support more bits (for example, 64 to 256 bits) than existing PUCCH formats can.

It may be possible to use a configuration that is completely different from existing PUCCH formats, as a new PUCCH format that can transmit uplink control signals (for example, HARQ-ACKs) corresponding to 6 or more CCs. However, in this case, it is necessary to allocate new resources (PRBs) to the new PUCCH format, which raises the problem that the system's overall UL overhead increases.

So, the present inventors have come up with the idea of using a configuration that has larger capacity than existing PUCCH formats and that can be multiplexed and transmitted on the same resource with existing channels or signals (for example, PUCCH formats and/or the PUSCH), as a new PUCCH format. Also, the present inventors have come up with the idea of using part of existing PUCCH format 3 and/or PUSCH configuration in order to design a new PUCCH format.

Figure 3A:
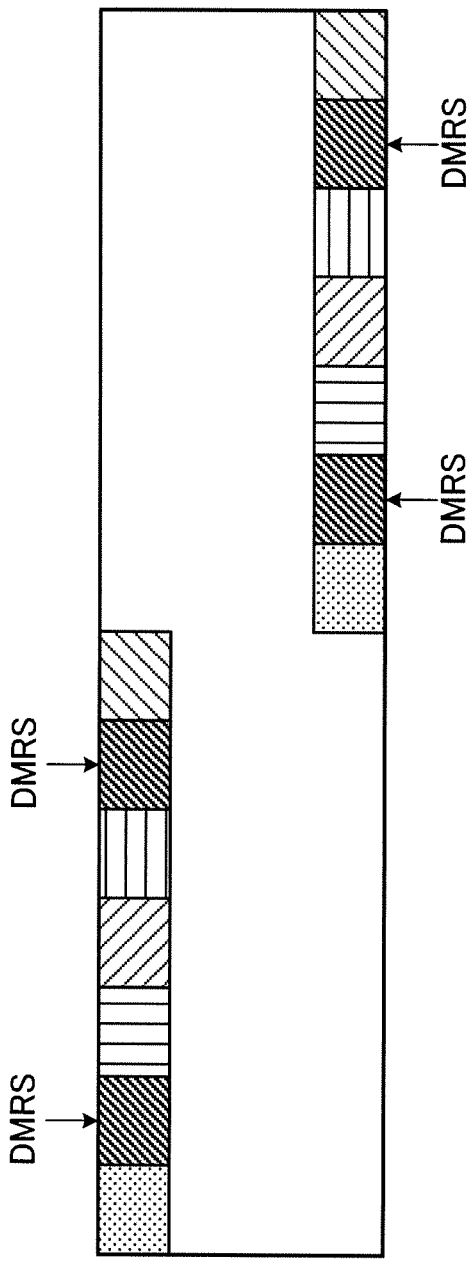
FIG. 3 provide diagrams, each showing an example of a PUCCH format that can support larger capacity than existing PUCCH formats.

In the physical layer configuration of existing PUCCH format 3, two reference signals (reference signal symbols) are configured per slot. Therefore, when QPSK modulation is applied, without spreading, to symbols that can be used for HARQ-ACKs, it is possible to support transmission of HARQ-ACKs up to 240 bits (=2 (bits)×12 (subcarriers)×10 (symbols)) (see FIG. 3A).

Figure 3B:
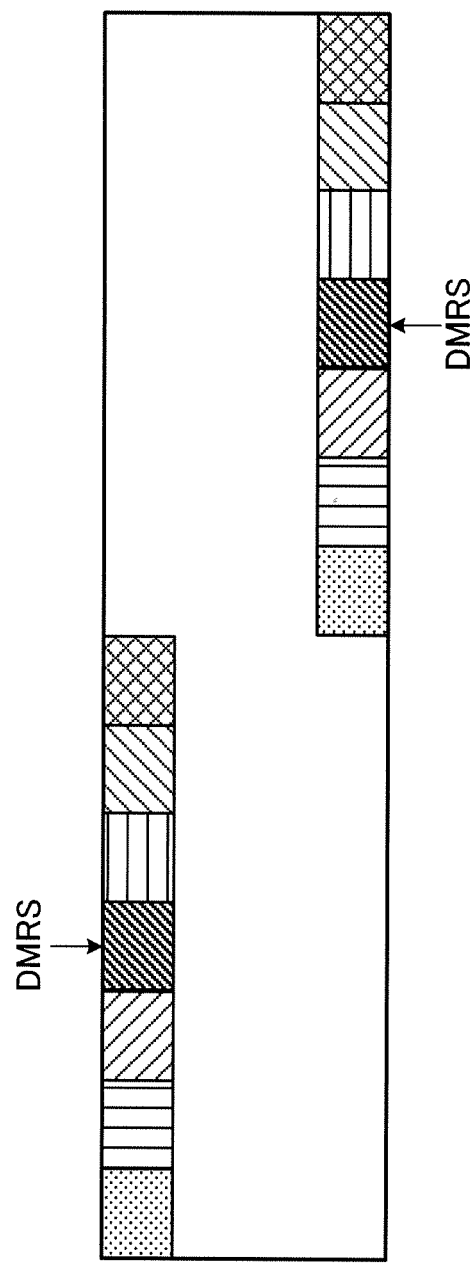

Also, in the physical layer configuration of the PUSCH, one reference signal (reference signal symbol) is configured per slot. Therefore, when QPSK modulation is applied, without spreading, to symbols that can be used for HARQ- ACKs, it is possible to support transmission of HARQ-ACKs up to 288 bits (=2 (bits)×12 (subcarriers)×12 (symbols)) (see FIG. 3B).

However, when designing a new PUCCH format using existing PUCCH format 3 or PUSCH, it is difficult to make UL control signals such as HARQ-ACKs have the same multiplexing capability as in existing PUCCH formats. This is because, if the payload of the PUCCH is made bigger, then the spreading factor needs to be made smaller in order to suppress the deterioration of communication quality.

Meanwhile, the present inventors have paid attention to the point that, if space division multiplexing is applied to uplink control information (for example, HARQ-ACKs) that is transmitted using non-DMRS symbols, then the uplink control information can be demultiplexed on the radio base station side by using MIMO signal processing techniques. That is, the present inventors have focused on the fact that, if the radio base station side has space division demultiplexing capability (that is, if the radio base station side has a larger number of receiving antennas than the number of users spatially multiplexed), uplink control signals can also be demultiplexed on the side of the radio base station by making DMRSs capable of demultiplexing by applying CDM, performing channel estimation on a per user terminal basis using these DMRSs, and performing the same spatial signal demultiplexing process as in MIMO based on the channel estimation results obtained.

To be more specific, the present inventors have come up with the idea of designing a new PUCCH format so that DMRSs can be orthogonal-division-multiplexed (CDM) with existing PUCCH formats and/or the PUSCH, and the capacity of signals to allocate to symbols other than DMRSs is greater than in existing PUCCH formats. For example, as a new PUCCH format, a configuration, in which cyclic shifts and/or orthogonal codes are applied to first symbols for DMRSs, and in which orthogonal codes are not applied or orthogonal codes having a sequence length less than a predetermined value are applied to non-DMRS second symbols, can be used. Here, the sequence length less than a predetermined value may be, for example, a sequence length that is shorter than the sequence length used in existing PUCCH format 3 (for example, 5).

Now, the present embodiment will be described the following in detail. Although examples will be shown in the following description where the number of CCs that can be configured per user terminal in CA is 32, this is not limiting. Also, although, in order to illustrate new PUCCH formats, cases will be shown where delivery acknowledgment signals (HARQ-ACKs) are transmitted using symbols other than the DMRS, this is by no means limiting. For example, a new PUCCH formats may be applied to the transmission of other uplink control signals (for example, channel state information (CSI) such as CQI, PMI and RI).

First Example

In a first example, a new PUCCH format with DMRSs that can be orthogonally multiplexed (CDM) with DMRSs of existing PUCCH formats (for example, PUCCH format 3) will be described.

Figure 4:
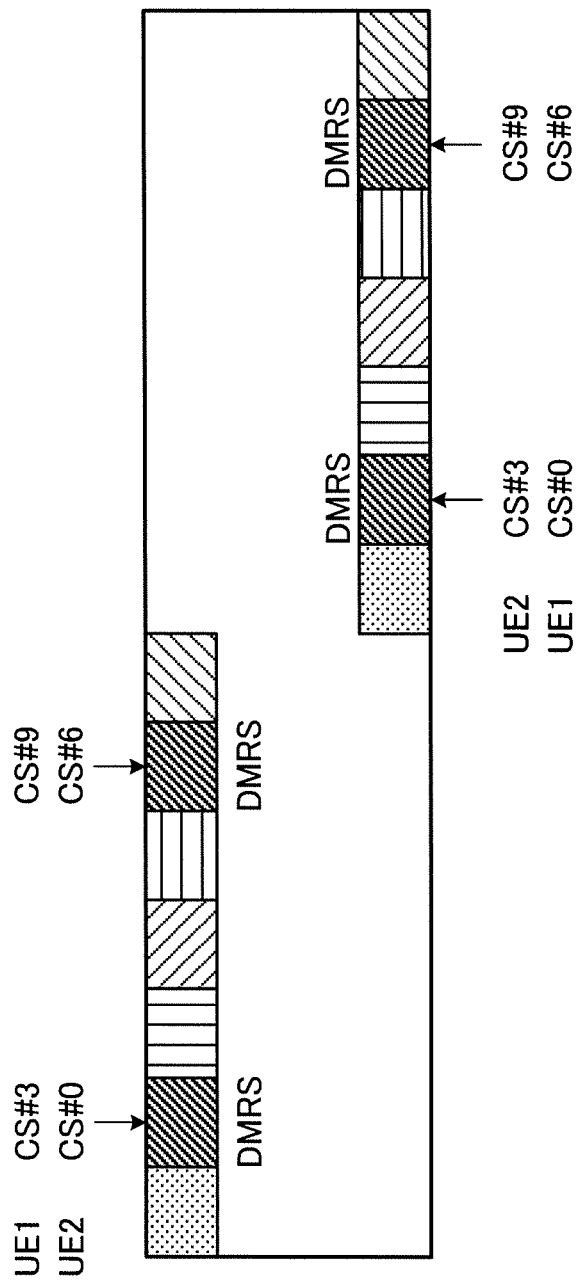
FIG. 4 is a diagram to show an example of a new PUCCH format according to the present embodiment.

An example of the physical layer configuration of the new PUCCH format according to the first example is shown in FIG. 4. In the PUCCH format shown in FIG. 4, in each slot (the first half slot and the second half slot), two first symbols are configured for DMRSs, and, apart from the DMRSs, five second symbols are configured.

In the new PUCCH format shown in FIG. 4, cyclic shifts are applied to the first symbols for DMRSs so that these symbols can be orthogonally multiplexed with DMRSs of existing PUCCH formats. Also, apart from the first symbols, orthogonal codes are not applied to the second symbols, or orthogonal codes having a shorter sequence length than the sequence length (for example, 5) adopted in existing PUCCH format 3 are applied. As an example, a UE 1 multiplies the DMRSs of the new PUCCH format by CS #3 and CS #9 and by CS #0 and CS #6, while a UE 2 multiplies the DMRSs by CS #0 and CS #6 and by CS #3 and CS #9, so that the DMRSs can be multiplexed orthogonally between these user terminals.

The user terminals can use DMRSs that can be expressed by the same equation as existing PUCCH format 3 as DMRSs for the new PUCCH format. As a result, even when a plurality of user terminals that transmit uplink control information using existing PUCCH formats 3 or a new PUCCH format are allocated to the same area (PRB), the radio base station can separate the channel estimation result of each user terminal. Note that it is not always necessary to apply the same equation as that of PUCCH format 3.

In addition, the HARQ-ACK bit sequence can be multiplexed on the second symbols. Even when the user terminals transmit uplink control information in the second symbols without applying code multiplexing, the DMRSs are code division multiplexed between the user terminals, so that channel estimation can be performed appropriately for each user terminal. In this way, the radio base station uses multiple receiving antennas (MU-MIMO mechanism), so that HARQ-ACKs of different user terminals multiplexed on the same PRB can be demultiplexed spatially and received.

In this manner, by using the new PUCCH format shown in FIG. 4, it is possible to support transmission of larger capacity than existing PUCCH formats, so that it is possible to use the resources allocated in existing PUCCH format 3. This enables a configuration that does not allocate new resources (PRBs) to the new PUCCH format, so it is possible to suppress an increase in UL overhead.

<CS to Apply to DMRS>

The user terminal can determine the cyclic shift indices (CS indices) to apply to the DMRSs in the new PUCCH format based on predetermined conditions. For example, the user terminal can determine the CS index to apply to a DMRS using equation 1 below:

$$n_{cs}^{(\tilde{p})}(n_s,l)=(n_{cs}^{cell}(n_s,l)+n'_{\tilde{p}}(n_s)) \mod N_{sc}^{RB} \quad \text{(Equation 1)}$$

where:

$n_{cs}^{cell}(n_s,l)$ is the CS index, which is determined by the physical cell ID, the virtual cell ID, the slot index and the symbol index;

$n'_{\tilde{p}}(n_s)$ is the value determined by the PUCCH resource index specified in the ARI; and $N_{sc}^{RB}$ is the number of subcarriers per RB.

To be more specific, $n'_{\tilde{p}}(n_s)$ can be determined from $(n_{oc,0}^{(\tilde{p})})$, which is determined from a PUCCH resource index candidate value $(n_{PUCCH}^{(3,\tilde{p})})$ that can be specified in the ARI (ACK/NACK Resource Indicator), and the table shown in FIG. 5, based on following equations 2:

$$n_{oc,0}^{(\tilde{p})} = n_{PUCCH}^{(3,\tilde{p})} \mod N_{SF,1}^{PUCCH} \quad \text{(Equations 2)}$$

$$n_{oc,1}^{(\tilde{p})} = \begin{cases} (3n_{oc,0}^{(\tilde{p})}) \mod N_{SF,1}^{PUCCH} & \text{if } N_{SF,1}^{PUCCH} = 5 \\ n_{oc,0}^{(\tilde{p})} \mod N_{SF,1}^{PUCCH} & \text{otherwise} \end{cases}$$

where $N_{SF,1}^{PUCCH}$ is the number of non-DMRS symbols per slot in a subframe.

The ARI refers to identification information for designating radio resources for delivery acknowledgment signals. For example, the user terminal can decide the radio resources for delivery acknowledgment signals in existing PUCCH format 3 based on the ARI field configured in downlink control information. Also, when carrier aggregation to use a primary cell and secondary cells is employed, the user terminal can interpret the TPC command field included in the downlink control information (DL assignment) of the secondary cells as the ARI field. The user terminal can determine the radio resources to use for delivery acknowledgment signals by using the value specified in the ARI field, from among multiple candidate values that are configured in advance.

<Application of Orthogonal Code>

Delivery acknowledgment signals (HARQ-ACK bit sequence) can be transmitted in symbols (second symbols) where DMRSs are not allocated. In this case, a configuration may be used here in which orthogonal codes are not applied to the second symbols and spreading itself is not performed (see FIG. 6A), or a configuration may be used in which the spreading process is performed using orthogonal codes (OCCs) having a sequence length less than 5 (see FIG. 6B).

Figure 6A:
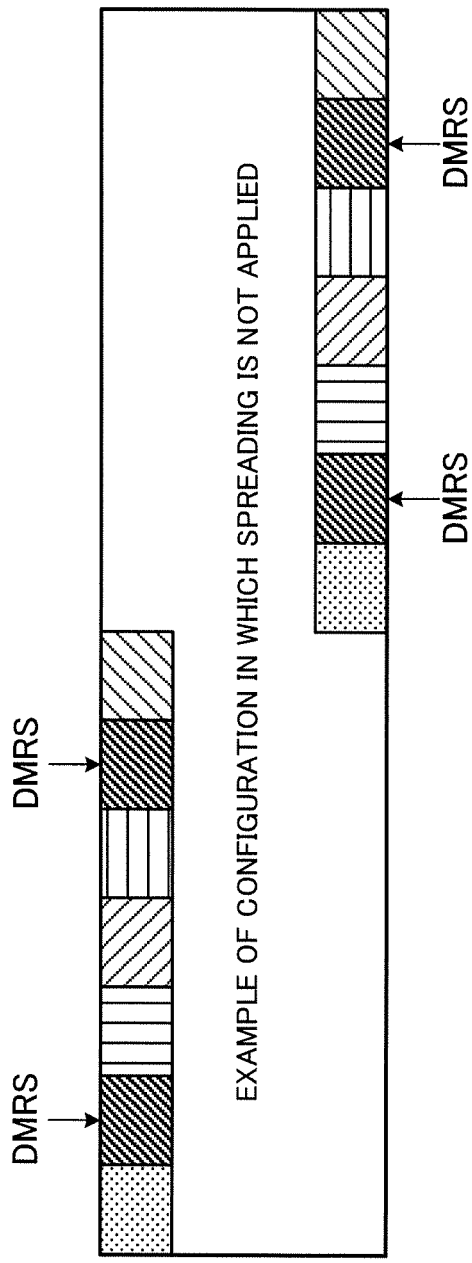
FIG. 6 provide diagrams, each showing another example of a new PUCCH format according to the present embodiment.

As shown in FIG. 6A, when orthogonal codes are not applied to the second symbols, the number of PUCCHs that can be orthogonally multiplexed (CDM) on the same PRB is 1 and the number of bits that can be transmitted in this PUCCH format is 240 bits. The PUCCH format configuration shown in FIG. 6A can be suitably applied when the number of bits of uplink control information (for example, HARQ-ACKs) transmitted by the user terminal is large (for example, when the number of connecting CCs is large, when TDD is applied, etc.).

Figure 6B:
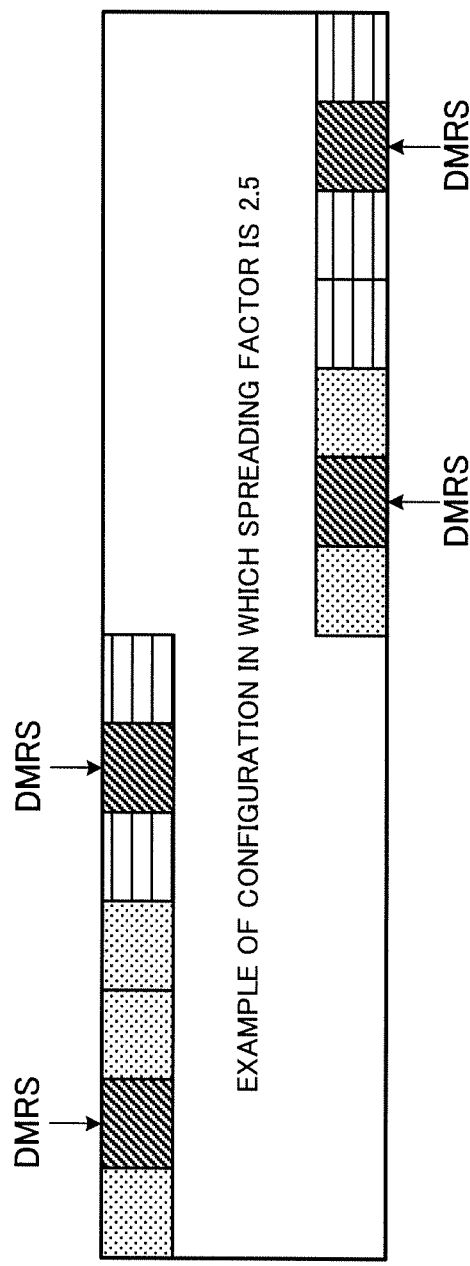

FIG. 6B shows a case where orthogonal codes (with a spreading factor of 2.5) are applied to the second symbols. In this case, the number of PUCCHs that can be orthogonally multiplexed (CDM) with the same PRB is 2 (two user terminals can be code-division-multiplexed), and the bits that can be transmitted in this PUCCH format are 96 bits. The PUCCH format shown in FIG. 6B can be suitably applied when the number of bits of uplink control information (for example, HARQ-ACKs) transmitted by the user terminal is small (for example, when the number of connecting CCs is equal to or less than a predetermined value, when FDD is applied, etc.). Note that the spreading factor when applying orthogonal codes to the second symbols is not limited to 2.5.

Furthermore, the user terminal may switch and use the PUCCH format of FIG. 6A and the PUCCH format of FIG. 6B based on predetermined conditions. These predetermined conditions may include, for example, the number of CCs configured, the number of CCs uplink control information is transmitted, the number of uplink control information bits, whether or not spatial bundling is applied, the number of codewords applied (the number of transport blocks), the duplex mode (FDD/TDD), or any combination of these.

Furthermore, the user terminal informs the base station of terminal capability information (UE capability) indicating that either one or both of the PUCCH format of FIG. 6A and the PUCCH format of FIG. 6B can be configured. The terminal capability information may be signaling that is independent of the number of CCs that can be placed in CA, may be uniquely determined according to the number of CCs that can be placed in CA. When the terminal capability information is uniquely determined according to the number of CCs, independent signaling can be made unnecessary.

Note that the resource (PRB index) to use to transmit the new PUCCH format can be preconfigured in the user terminal by higher layer signaling. Alternatively, a configuration may be adopted here in which a plurality of PRBs (candidate PRBs) are configured in the user terminal by way of high layer signaling, and the user terminal selects a predetermined PRB from these candidate PRBs based on the ARI in downlink control information. When the ARI is used, the ARI specifies information for determining the CS indices to apply to DMRSs and the PRB index for transmitting the PUCCH.

Second Example

A new PUCCH format with DMRSs that can be orthogonally multiplexed (CDM) with existing PUSCH DMRSs will be described with a second example.

Figure 7:
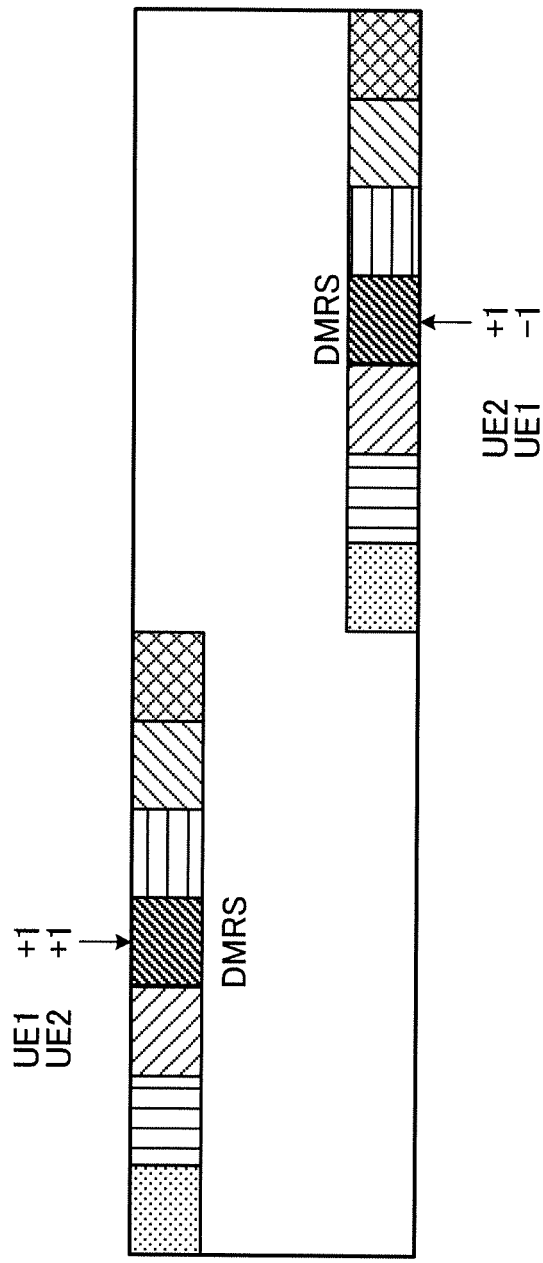
FIG. 7 is a diagram to show another example of a new PUCCH format according to the present embodiment.

An example of the physical layer configuration of the new PUCCH format according to the second example is shown in FIG. 7. In the new PUCCH format shown in FIG. 7, in one slot, one first symbol for a DMRS is configured, and six non-DMRS second symbols are configured.

In addition, in the new PUCCH format shown in FIG. 7, a cyclic shift and/or an orthogonal code (OCC) is applied to the first symbol for a DMRS so that this symbol can be orthogonally multiplexed with a PUSCH DMRS. In addition, apart from the DMRS symbol, orthogonal codes are not applied to the second symbols, or orthogonal codes having a shorter sequence length than a predetermined sequence length are applied. For example, the UE 1 multiplies the DMRS of the new PUCCH format by orthogonal codes of [+1 −1] and the UE 2 multiplies the DMRS by orthogonal codes of [+1 +1], so that the DMRSs can be multiplexed orthogonally between these user terminals.

The user terminals can use a DMRS that can be expressed by the same equation as that of the PUSCH, as the DMRS for the new PUCCH format. By this means, even when a user terminal that transmits uplink control information using the new PUCCH format and a user terminal that transmits uplink data (PUSCH) using the PUSCH use the same area (PRB), the radio base station can separate the channel estimation result of each user terminal. Of course, even when a plurality of user terminals that transmit uplink control information using the new PUCCH format are allocated to the same area (PRB), the radio base station can aril separate the channel estimation result of each user terminal. Note that it is not always necessary to apply the same equation as the PUSCH.

In addition, the HARQ-ACK bit sequence can be multiplexed on the second symbols. When the user terminals transmit uplink control information in the second symbols without applying code multiplexing the radio base station side uses multiple receiving antennas (MU-MIMO mechanism), so that, based on space division (MU-MIMO mechanism), the uplink control information can be demultiplexed spatially and received.

In this manner, by using the new PUCCH format shown in FIG. 4, it is possible to support transmission of larger capacity than existing PUCCH formats, so that it is possible to use the resources allocated to the PUSCH. This enables a configuration that does not allocate new resources (PRBs) to the new PUCCH format, so it is possible to suppress an increase in UL overhead.

<CS/OCC to Apply to DMRS>

The user terminal can determine the cyclic shift index (CS index) and/or orthogonal sequence (OCC) to apply to the DMRS in the new PUCCH format based on predetermined conditions. For example, the user terminal can determine the CS index to apply to a DMRS using equation 3 below:

$$n_{cs,\lambda}=(n_{DMRS}^{(1)}+n_{DMRS,\lambda}^{(2)}+n_{PN}(n_s))\bmod 12 \quad \text{(Equation 3)}$$

where: $n_{DMRS}^{(1)}$ is a value reported in higher layer signaling;

$n_{DMRS,\lambda}^{(2)}$ is a value determined by a CS/OCC indicator included in downlink control information; and $n_{PN}(n_s)$ is a pseudo-random sequence (PN sequence) determined by the physical cell ID (PCID).

For the above value to be reported by higher layer signaling, a value that is configured by higher layer signaling that is different from higher layer signaling for the PUSCH may be used, or the value of higher layer signaling configured for the PUSCH may be used. If higher layer signaling for the PUSCH is applied to the new PUCCH format, the signaling overhead can be reduced. Also, if higher layer signaling that is different from the higher layer signaling of the PUSCH is can be used for the new PUCCH format, it then becomes possible to implement flexible control, such as, for example, configuring a CS index independent of the PUSCH of the connecting cell, while, on the other hand, configuring a common index with the PUSCH of another cell (for example, a neighboring cell).

When high layer signaling configured for the PUSCH is applied, for example, the physical cell ID (VCID), which is configured to determine the DMRS sequence of the PUSCH, information about the setting of inter-slot hopping (group-hopping-enabled, disable-sequence-group-hopping, etc.) and information about the configuration of whether or not OCCs can be applied (activate-DMRS-with OCC) and so on can also be applied to the DMRS in new PUCCH format.

Furthermore, the user terminal can determine an orthogonal code (OCC) from a predetermined table based on bit information (index) notified from the radio base station (see FIG. 8). For example, similar to the DMRS of the PUSCH, the user terminal can select a predetermined orthogonal sequence based on the bit information specified by the CS/OCC indicator (CS/OCC indicator) included in downlink control information. Note that the bit information specified by the CS/OCC indicator can also be used to determine the cyclic shift index.

However, since the CS/OCC indicator to use for the DMRS of the PUSCH is included in the UL grant, it is difficult to apply this to the DMRS of the new PUCCH on an as-is basis. Accordingly, in the present embodiment, a bit field (cyclic shift for DM RS and OCC index) that is the same as the existing CS/OCC indicator or that corresponds to the existing CS/OCC indicator may be configured in the DL assignment transmitted in the PDCCH or the EPDCCH, for the DMRS of the new PUCCH format. In this case, the user terminal determines the bit length assuming that the CS/OCC indicator is included in the DL assignment, and performs the receiving process (for example, blind detection) in accordance with this bit length.

Similar to the CS/OCC indicator for the DMRS of the PUSCH, configured in the UL grant, the CS/OCC indicator for the DMRS of the new PUCCH format, configured in the DL assignment, can be made 3 bits. Alternatively, the bit field in which the CS/OCC indicator for the DMRS of the new PUCCH format may be a bit field larger than 3 bits or may be a bit field less than 3 bits. When configuring a bit field that is less than 3 bits, a table may be formed by extracting some of the bit information from the table of FIG. 8.

Alternatively, when configuring a bit field that is less than 3 bits, it may be possible to configure a plurality of CS/OCC indicator candidates in the user terminal in advance by higher layer signaling, and select a predetermined CS/OCC indicator based on the CS/OCC indicator of the DL assignment. This makes it possible to flexibly control the CS/OCC indicators even when the number of bits to configure in the DL assignment is small.

Alternatively, when using the new PUCCH format, the user terminal may determine the CS/OCC index to apply to the DMRS of the new PUCCH format by using the 2-bit TPC command included in the DL assignment of the secondary cells. In this case, the user terminal interprets the 2-bit TPC command contained in the DL assignment of secondary cells as the ARI. Based on the index specified by the ARI, the user terminal can determine a specific CS/OCC index from multiple candidate CS/OCC indicators preconfigured by higher layer signaling or from a predetermined table. Also, the radio base station may be configured to indicate to the user terminal the PRB that transmits the new PUCCH format, using the ARI.

(Structure of Radio Communication System)

Now, the structure of the radio communication system according to an embodiment of the present invention will be described below. In this radio communication system, the radio communication methods according to the embodiment of the present invention are employed. Note that the radio communication methods of the above-described examples may be applied individually or may be applied in combination.

Figure 9:
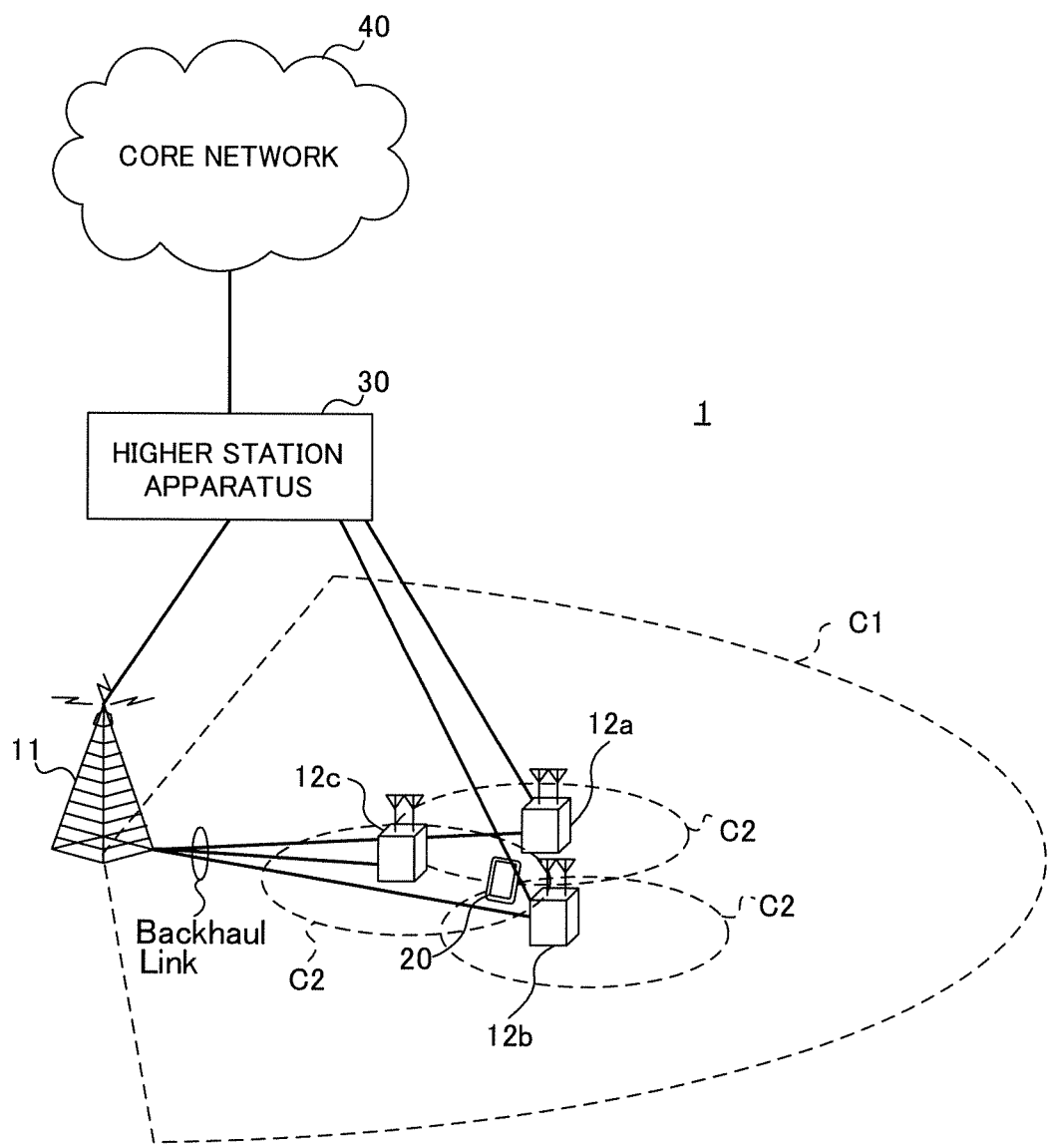
FIG. 9 is a diagram to show an example of a schematic structure of a radio communication system according to the present embodiment.

FIG. 9 is a diagram to show an example of a schematic structure of a radio communication system according to an embodiment of the present invention. Note that the radio communication system shown in FIG. 9 is a system to incorporate, for example, an LTE system, super 3G, an LTE-A system and so on. This radio communication system can adopt carrier aggregation (CA) to group a plurality of fundamental frequency blocks (component carriers) into one, where the LTE system bandwidth constitutes one unit, and/or adopt dual connectivity (DC). Note that this radio communication system may be referred to as "IMT-Advanced," or may be referred to as "4G," "5G," "FRA" (Future Radio Access) and so on.

The radio communication system 1 shown in FIG. 9 includes a radio base station 11 that forms a macro cell C1, and radio base stations 12a to 12c that form small cells C2, which are placed within the macro cell C1 and which are narrower than the macro cell C1. Also, user terminals 20 are placed in the macro cell C1 and in each small cell C2.

The user terminals 20 can connect with both the radio base station 11 and the radio base stations 12. The user terminals 20 may use the macro cell C1 and the small cells C2, which use different frequencies, at the same time, by means of CA or DC. Also, the user terminals 20 can execute CA or DC by using at least six or more CCs (cells).

Between the user terminals 20 and the radio base station 11, communication can be carried out using a carrier of a relatively low frequency band (for example, 2 GHz) and a narrow bandwidth (referred to as, for example, an "existing carrier," a "legacy carrier" and so on). Meanwhile, between the user terminals 20 and the radio base stations 12, a carrier of a relatively high frequency band (for example, 3.5 GHz, 5 GHz and so on) and a wide bandwidth may be used, or the same carrier as that used in the radio base station 11 may be used. Between the radio base station 11 and the radio base stations 12 (or between two radio base stations 12), wire connection (optical fiber, the X2 interface, etc.) or wireless connection may be established.

The radio base station 11 and the radio base stations 12 are each connected with a higher station apparatus 30, and are connected with a core network 40 via the higher station apparatus 30. Note that the higher station apparatus 30 may be, for example, an access gateway apparatus, a radio network controller (RNC), a mobility management entity (MME) and so on, but is by no means limited to these. Also, each radio base station 12 may be connected with higher station apparatus 30 via the radio base station 11.

Note that the radio base station 11 is a radio base station having a relatively wide coverage, and may be referred to as a "macro base station," a "central node," an "eNB" (eNodeB), a "transmitting/receiving point" and so on. Also, the radio base stations 12 are radio base stations having local coverages, and may be referred to as "small base stations," "micro base stations," "pico base stations," "femto base stations," "HeNBs" (Home eNodeBs), "RRHs" (Remote Radio Heads), "transmitting/receiving points" and so on. Hereinafter the radio base stations 11 and 12 will be collectively referred to as "radio base stations 10," unless specified otherwise. The user terminals 20 are terminals to support various communication schemes such as LTE, LTE-A and so on, and may be either mobile communication terminals or stationary communication terminals.

In the radio communication system, as radio access schemes, OFDMA (Orthogonal Frequency Division Multiple Access) is applied to the downlink, and SC-FDMA (Single-Carrier Frequency Division Multiple Access) is applied to the uplink. OFDMA is a multi-carrier communication scheme to perform communication by dividing a frequency bandwidth into a plurality of narrow frequency bandwidths (subcarriers) and mapping data to each subcarrier. SC-FDMA is a single-carrier communication scheme to mitigate interference between terminals by dividing the system bandwidth into bands formed with one or continuous resource blocks per terminal, and allowing a plurality of terminals to use mutually different bands. Note that the uplink and downlink radio access schemes are by no means limited to the combination of these.

In the radio communication system 1, a downlink shared channel (PDSCH: Physical Downlink Shared CHannel), which is used by each user terminal 20 on a shared basis, a broadcast channel (PBCH: Physical Broadcast CHannel), downlink L1/L2 control channels and so on are used as downlink channels. User data, higher layer control information and predetermined SIBs (System Information Blocks) are communicated in the PDSCH. Also, the MIB (Master Information Block) and so on are communicated by the PBCH.

The downlink L1/L2 control channels include a PDCCH (Physical Downlink Control CHannel), an EPDCCH (Enhanced Physical Downlink Control CHannel), a PCFICH (Physical Control Format Indicator CHannel), a PHICH (Physical Hybrid-ARQ Indicator CHannel) and so on. Downlink control information (DCI) including PDSCH and PUSCH scheduling information is communicated by the PDCCH. The number of OFDM symbols to use for the PDCCH is communicated by the PCFICH. HARQ delivery acknowledgement signals (ACKs/NACKs) in response to the PUSCH are communicated by the PHICH. The EPDCCH may be frequency-division-multiplexed with the PDSCH (downlink shared data channel) and used to communicate DCI and so on, like the PDCCH.

In the radio communication system 1, an uplink shared channel (PUSCH: Physical Uplink Shared CHannel), which is used by each user terminal 20 on a shared basis, an uplink control channel (PUCCH: Physical Uplink Control CHannel), a random access channel (PRACH: Physical Random Access CHannel) and so on are used as uplink channels. User data and higher layer control information are communicated by the PUSCH. Also, downlink radio quality information (CQI: Channel Quality Indicator), delivery acknowledgement signals (HARQ-ACK) and so on are communicated by the PUCCH. By means of the PRACH, random access preambles (RA preambles) for establishing connections with cells are communicated.

<Radio Base Station>

Figure 10:
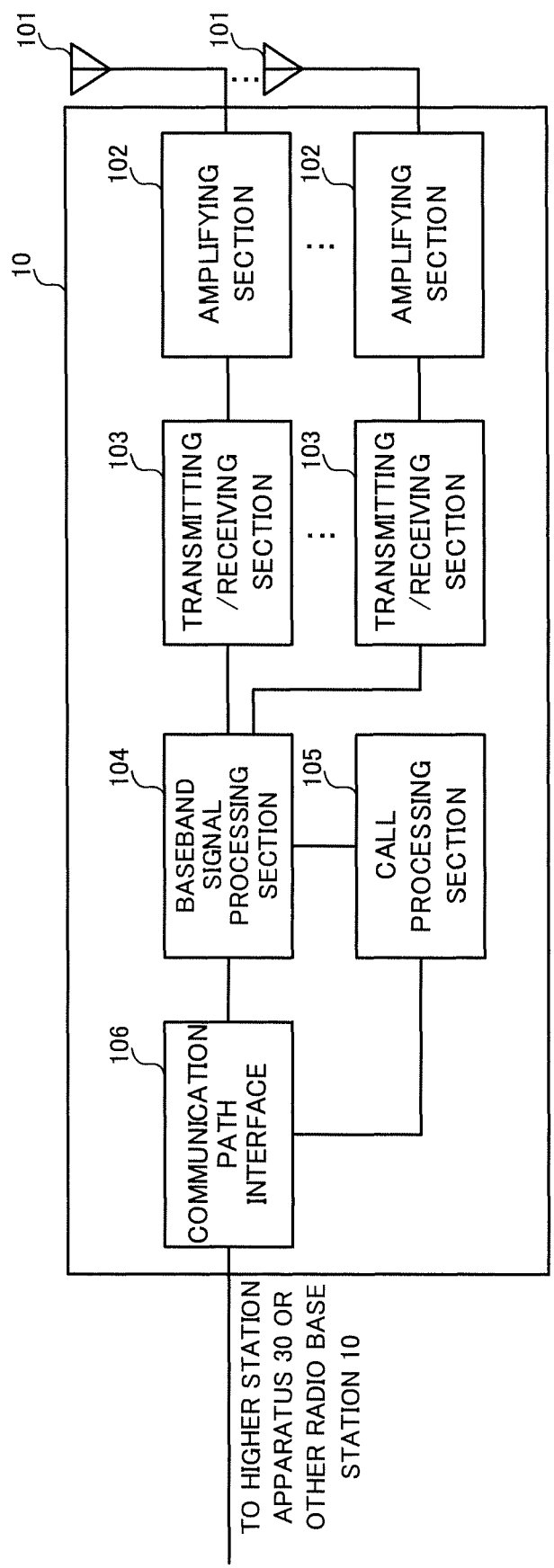
FIG. 10 is a diagram to show an example of an overall structure of a radio base station according to the present embodiment.

FIG. 10 is a diagram to show an example of an overall structure of a radio base station according to one embodiment of the present invention. A radio base station 10 has a plurality of transmitting/receiving antennas 101, amplifying sections 102, transmitting/receiving sections 103, a baseband signal processing section 104, a call processing section 105 and a communication path interface 106. Note that the transmitting/receiving sections 103 are comprised of transmitting sections and receiving sections.

User data to be transmitted from the radio base station 10 to a user terminal 20 on the downlink is input from the higher station apparatus 30 to the baseband signal processing section 104, via the communication path interface 106.

In the baseband signal processing section 104, the user data is subjected to a PDCP (Packet Data Convergence Protocol) layer process, user data division and coupling, RLC (Radio Link Control) layer transmission processes such as RLC retransmission control, MAC (Medium Access Control) retransmission control (for example, an HARQ (Hybrid Automatic Repeat reQuest) transmission process), scheduling, transport format selection, channel coding, an inverse fast Fourier transform (IFFT) process and a precoding process, and the result is forwarded to each transmitting/receiving section 103. Furthermore, downlink control signals are also subjected to transmission processes such as channel coding and an inverse fast Fourier transform, and forwarded to each transmitting/receiving section 103.

Each transmitting/receiving section 103 converts baseband signals that are pre-coded and output from the baseband signal processing section 104 on a per antenna basis, into a radio frequency band. The radio frequency signals having been subjected to frequency conversion in the transmitting/receiving sections 103 are amplified in the amplifying sections 102, and transmitted from the transmitting/receiving antennas 101.

For example, transmitting/receiving section 103 can transmit information about the CCs to be in CA (information about the frequency, the number of CCs and so on). Furthermore, the transmitting/receiving sections 103 can transmit information about the UCI transmission method (for example, a new PUCCH format) adopted in Rel. 13 and later versions, information about the PUCCH resource used when adopting a predetermined PUCCH format, and so on. Note that, for the transmitting/receiving sections 103, transmitters/receivers, transmitting/receiving circuits or transmitting/receiving devices that can be described based on common understanding of the technical field to which the present invention pertains can be used.

Meanwhile, as for uplink signals, radio frequency signals that are received in the transmitting/receiving antennas 101 are each amplified in the amplifying sections 102. Each transmitting/receiving section 103 receives uplink signals amplified in the amplifying sections 102. Furthermore, by using a larger number of transmitting/receiving antennas 101 than the number of user terminals that are spatially multiplexed, the transmitting/receiving sections 103 can spatially demultiplex and receive the uplink control signals (such as HARQ-ACKs) and/or the uplink data (PUSCH) multiplexed on the same PRB using a new PUCCH format. The received signals are converted into the baseband signal through frequency conversion in the transmitting/receiving sections 103 and output to the baseband signal processing section 104.

In the baseband signal processing section 104, user data that is included in the uplink signals that are input is subjected to a fast Fourier transform (FFT) process, an inverse discrete Fourier transform (IDFT) process, error correction decoding, a MAC retransmission control receiving process, and RLC layer and PDCP layer receiving processes, and forwarded to the higher station apparatus 30 via the communication path interface 106. The call processing section 105 performs call processing such as setting up and releasing communication channels, manages the state of the radio base station 10 and manages the radio resources.

The communication path interface section 106 transmits and receives signals to and from the higher station apparatus 30 via a predetermined interface. The communication path interface 106 transmits and receive s signals to and from neighboring radio base stations 10 (backhaul signaling) via an inter-base station interface (for example, optical fiber, the X2 interface, etc.).

Figure 11:
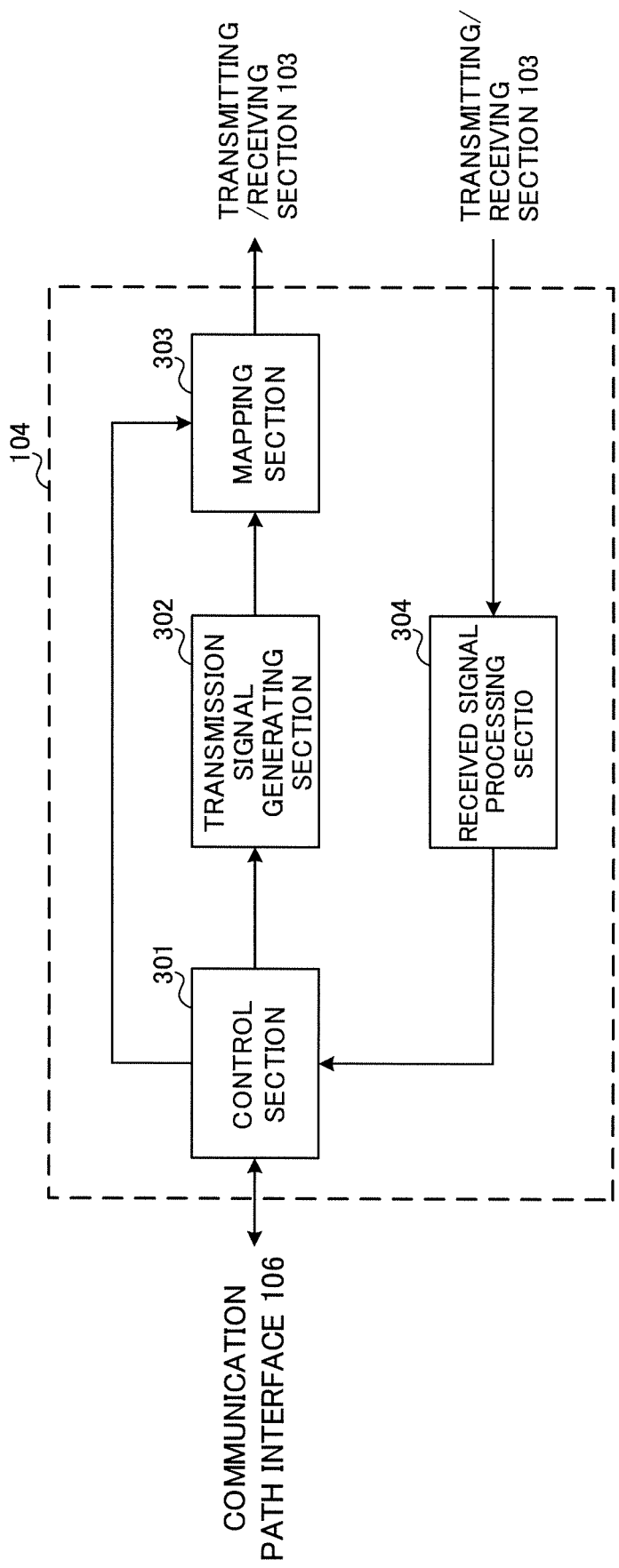
FIG. 11 is a diagram to show an example of a functional structure of a radio base station according to the present embodiment.

FIG. 11 is a diagram to show an example of a functional structure of a radio base station according to the present embodiment. Note that, although FIG. 11 primarily shows functional blocks that pertain to characteristic parts of the present embodiment, the radio base station 10 has other functional blocks that are necessary for radio communication as well. As shown in FIG. 11, the baseband signal processing section 104 has a control section (scheduler) 301, a transmission signal generation section (generation section) 302, a mapping section 303 and a received signal processing section 304.

The control section (scheduler) 301 controls the scheduling (for example, resource allocation) of downlink data signals that are transmitted in the PDSCH and downlink control signals that are communicated in the PDCCH and/or the EPDCCH. Also, the control section 301 controls the scheduling of system information, synchronization signals, paging information, CRSs (Cell-specific Reference Signals), CSI-RSs (Channel State Information Reference Signals) and so on. Also, the control section 301 controls the scheduling of uplink reference signals, uplink data signals that are transmitted in the PUSCH, uplink control signals that are transmitted in the PUCCH and/or the PUSCH, random access preambles that are transmitted in the PRACH, and so on.

The control section 301 controls the retransmission of downlink data based on delivery acknowledgment signals (HARQ-ACK) fed back from the user terminals. For the control section 301, a controller, a control circuit or a control device that can be described based on common understanding of the technical field to which the present invention pertains can be used.

The transmission signal generation section 302 generates DL signals based on commands from the control section 301 and outputs these signals to the mapping section 303. For example, the transmission signal generation section 302 generates DL assignments, which report downlink signal allocation information, and UL grants, which report uplink signal allocation information, based on commands from the control section 301. Also, the downlink data signals are subjected to a coding process and a modulation process, based on coding rates and modulation schemes that are selected based on channel state information (CSI) from each user terminal 20 and so on.

The transmission signal generation section 302 can generate information about the CS indices and/or the direct sequences (OCCs) which the user terminal can apply to DMRSs in the new PUCCH format. For example, the transmission signal generation section 302 generates downlink control information (UL grant and/or DL assignment) including information about the ARI, information about the CS/OCC indicator and so on.

For the transmission signal generation section 302, a signal generator, a signal generating circuit or a signal generating device that can be described based on common understanding of the technical field to which the present invention pertains can be used.

The mapping section 303 maps the downlink signals generated in the transmission signal generation section 302 to predetermined radio resources based on commands from the control section 301, and outputs these to the transmitting/receiving sections 103. Note that, for the mapping section 303, mapper, a mapping circuit or a mapping device that can be described based on common understanding of the technical field to which the present invention pertains can be used.

The received signal processing section 304 performs the receiving processes (for example, demapping, demodulation, decoding and so on) of the UL signals that are transmitted from the user terminals (for example, delivery acknowledgement signals (HARQ-ACKs), data signals that are transmitted in the PUSCH, random access preambles that are transmitted in the PRACH, and so on). The processing results are output to the control section 301.

Also, by using the received signals, the received signal processing section 304 may measure the received power (for example, the RSRP (Reference Signal Received Power)), the received quality (for example, the RSRQ (Reference Signal Received Quality)), channel states and so on. The measurement results may be output to the control section 301.

The receiving process section 304 can be constituted by a signal processor, a signal processing circuit or a signal processing device, and a measurer, a measurement circuit or a measurement device that can be described based on common understanding of the technical field to which the present invention pertains.

<User Terminal>

Figure 12:
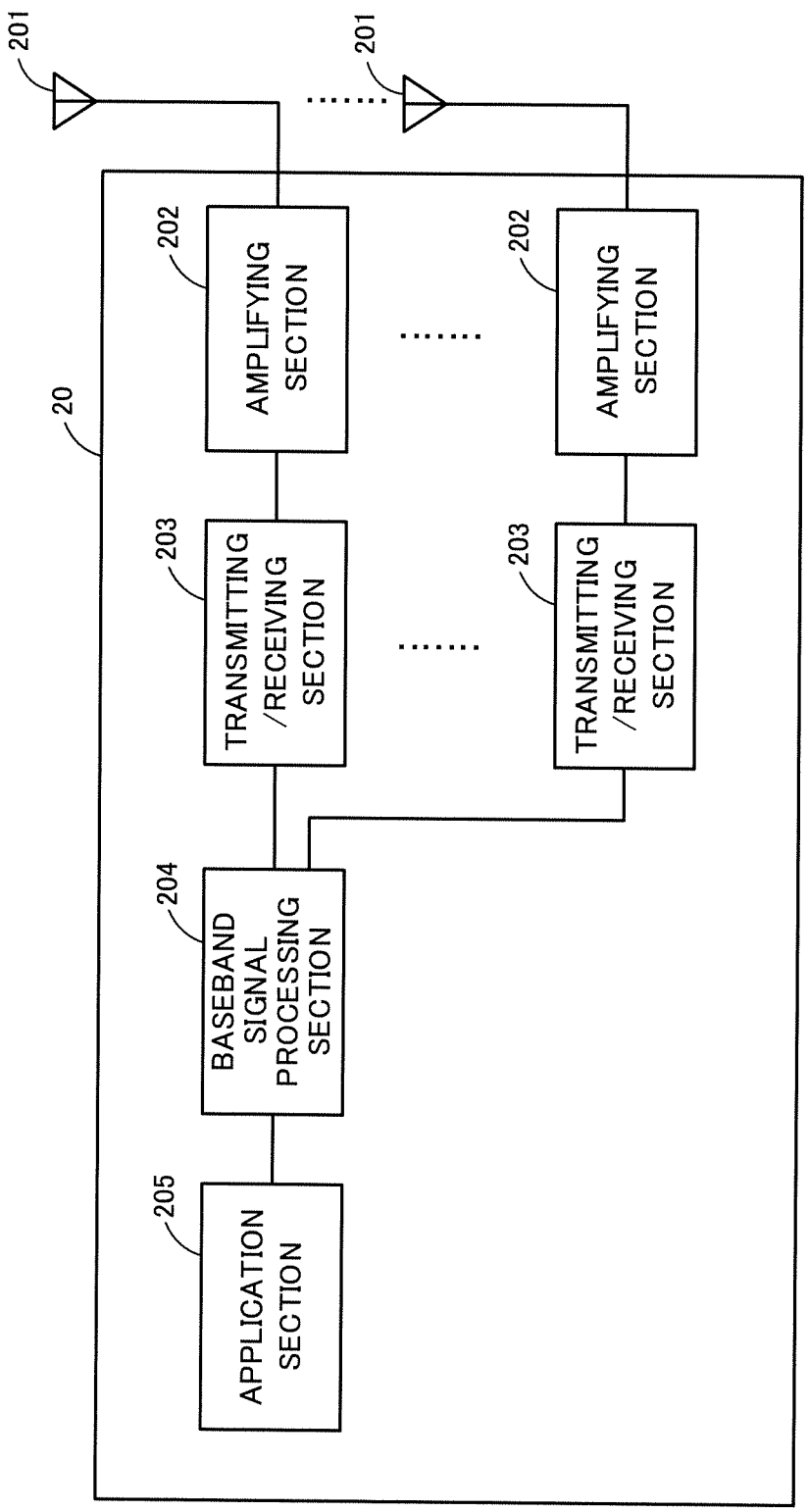
FIG. 12 is a diagram to show an example of an overall structure of a user terminal according to the present embodiment.

FIG. 12 is a diagram to show an example of an overall structure of a user terminal according to the present embodiment. A user terminal 20 has a plurality of transmitting/receiving antennas 201 for MIMO communication, amplifying sections 202, transmitting/receiving sections 203, a baseband signal processing section 204 and an application section 205. Note that the transmitting/receiving sections 203 may be comprised of transmitting sections and receiving sections.

Radio frequency signals that are received in a plurality of transmitting/receiving antennas 201 are each amplified in the amplifying sections 202. Each transmitting/receiving section 203 receives the downlink signals amplified in the amplifying sections 202. The received signal is subjected to frequency conversion and converted into the baseband signal in the transmitting/receiving sections 203, and output to the baseband signal processing section 204.

The transmitting/receiving sections 203 transmit UL control signals (PUCCH), including delivery acknowledgement signals in response to DL signals (for example, the PDSCH). Furthermore, the transmitting/receiving section 203 can receive information about the CS indices and/or the orthogonal codes (OCCs) to apply to DMRSs in the new PUCCH format. Furthermore, the transmitting/receiving section 203 can receive information about the allocated resources of UL control signal to be transmitted by applying the new PUCCH format. Note that, for the transmitting/receiving sections 203, transmitters/receivers, transmitting/receiving circuits or transmitting/receiving devices that can be described based on common understanding of the technical field to which the present invention pertains can be used.

In the baseband signal processing section 204, the baseband signal that is input is subjected to an FFT process, error correction decoding, a retransmission control receiving process, and so on. Downlink user data is forwarded to the application section 205. The application section 205 performs processes related to higher layers above the physical layer and the MAC layer, and so on. Furthermore, in the downlink data, broadcast information is also forwarded to the application section 205.

Meanwhile, uplink user data is input from the application section 205 to the baseband signal processing section 204. The baseband signal processing section 204 performs a retransmission control transmission process (for example, an HARQ transmission process), channel coding, pre-coding, a discrete Fourier transform (DFT) process, an IFFT process and so on, and the result is forwarded to each transmitting/receiving section 203. The baseband signal that is output from the baseband signal processing section 204 is converted into a radio frequency bandwidth in the transmitting/receiving sections 203. The radio frequency signals that are subjected to frequency conversion in the transmitting/receiving sections 203 are amplified in the amplifying sections 202, and transmitted from the transmitting/receiving antennas 201.

Figure 13:
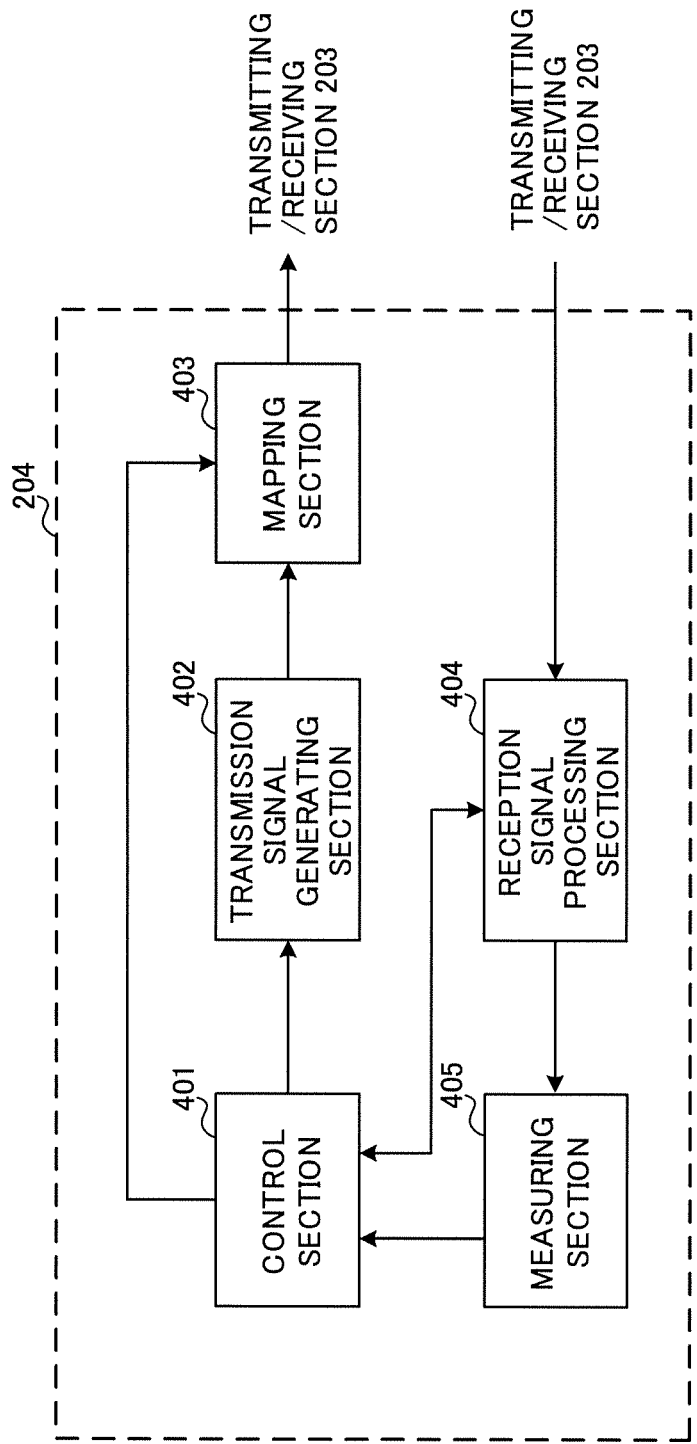
FIG. 13 is a diagram to show an example of a functional structure of a user terminal according to the present embodiment.

FIG. 13 is a diagram to show an example of a functional structure of a user terminal according to the present embodiment. Note that, although FIG. 13 primarily shows functional blocks that pertain to characteristic parts of the present embodiment, the user terminal 20 has other functional blocks that are necessary for radio communication as well. As shown in FIG. 13, the baseband signal processing section 204 provided in the user terminal 20 has a control section 401, a transmission signal generation section 402, a mapping section 403, a received signal processing section 404 and a decision section 405.

The control section 401 acquires the downlink control signals (signals transmitted in the PDCCH/EPDCCH) and downlink data signals (signals transmitted in the PDSCH) transmitted from the radio base station 10, from the received signal processing section 404. The control section 401 controls the generation of uplink control signals (for example, delivery acknowledgement signals (HARQ-ACKs) and so on) and uplink data signals based on the downlink control signals, the results of deciding whether or not re transmission control is necessary for the downlink data signals, and so on. To be more specific, the control section 401 can control the transmission signal generation section 402, the mapping section 403 and the received signal processing section 404.

For example, the control section 401 controls the format to apply to the transmission of UL control signals (for example, HARQ-ACKs). Furthermore, the control section 401 can apply a new format, having large capacity in comparison to the PUCCH formats of existing systems, to UL control signals, depending on the number of CCs configured, and so on.

For example, the control section 401 can control the transmission of UL control signals by using a new PUCCH format, in which cyclic shifts and/or orthogonal codes are applied to first symbols for DMRSs and in which orthogonal codes are not applied, or orthogonal codes having a shorter sequence length than the sequence length adopted in existing PUCCH format 3 are applied, to second symbols.

The control section 401 can apply cyclic shifts so that the DMRSs in the new PUCCH format can be made orthogonal to the DMRSs of existing PUCCH format 3. For example, the control section 401 can determine the cyclic shift values of the DMRSs in the new PUCCH format using the PUCCH resource indices specified by the ARI.

When UL control signals are transmitted using the new PUCCH format, the control section 401 can apply a PRB index reported by higher layer signaling, or apply a PRB index that is specified selected from candidate PRBs reported by higher layer signaling based on the ARI.

The control section 401 can apply cyclic shifts and/or orthogonal codes so that the DMRSs in the new PUCCH format can be made orthogonal to the DMRSs of an existing uplink shared channel (PUSCH). The control section 401 can determine the cyclic shift values and/or the orthogonal codes of the DMRSs of the new PUCCH format based on the index included in the DL assignment. Alternatively, the control section 401 can interpret the TPC command included in the DL assignment of secondary cells as the ARI and determine the cyclic shift values and/or orthogonal codes of the DMRSs of the new PUCCH format.

For the control section 401, a controller, a control circuit or a control device that can be described based on common understanding of the technical field to which the present invention pertains can be used.

The transmission signal generation section 402 generates UL signals based on commands from the control section 401, and outputs these signals to the mapping section 403. For example, the transmission signal generation section 402 generates uplink control signals such as delivery acknowledgement signals (HARQ-ACKs), channel state information (CSI) and so on, based on commands from the control section 401.

Also, the transmission signal generation section 402 generates uplink data signals based on commands from the control section 401. For example, when a UL grant is included in a downlink control signal that is reported from the radio base station 10, the control section 401 commands the transmission signal generation section 402 to generate an uplink data signal. For the transmission signal generation section 402, a signal generator, a signal generating circuit or a signal generating device that can be described based on common understanding of the technical field to which the present invention pertains can be used.

The mapping section 403 maps the uplink signals (uplink control signals and/or uplink data) generated in the transmission signal generation section 402 to radio resources based on commands from the control section 401, and output the result to the transmitting/receiving sections 203. For the mapping section 403, mapper, a mapping circuit or a mapping device that can be described based on common understanding of the technical field to which the present invention pertains can be used.

The received signal processing section 404 performs receiving processes (for example, demapping, demodulation, decoding and so on) of DL signals (for example, downlink control signals transmitted from the radio base station, downlink data signals transmitted in the PDSCH, and so on). The received signal processing section 404 outputs the information received from the radio base station 10, to the control section 401 and the decision section 405. The received signal processing section 404 outputs, for example, broadcast information, system information, RRC signaling, DCI and so on, to the control section 401.

The received signal processing section 404 can be constituted by a signal processor, a signal processing circuit or a signal processing device, and a measurer, a measurement circuit or a measurement device that can be described based on common understanding of the technical field to which the present invention pertains. Also, the received signal processing section 404 can constitute the receiving section according to the present invention.

The decision section 405 makes retransmission control decisions (ACKs/NACKs) based on the decoding results in the receiving process section 404, and, furthermore, outputs the results to the control section 401. When downlink signals (PDSCH) are transmitted from multiple CCs (for example, six or more CCs), retransmission control decisions (ACKs/NACKs) are made on a per CC basis, and output to the control section 401. For the decision section 405, a decision maker, a decision making circuit or a decision making device that can be described based on common understanding of the technical field to which the present invention pertains can be used.

Note that the block diagrams that have been used to describe the above embodiments show blocks in functional units. These functional blocks (components) may be implemented in arbitrary combinations of hardware and software. Also, the means for implementing each functional block is not particularly limited. That is, each functional block may be implemented with one physically-integrated device, or may be implemented by connecting two physically-separate devices via radio or wire and using these multiple devices.

For example, part or all of the functions of the radio base station 10 and the user terminal 20 may be implemented by using hardware such as an ASIC (Application-Specific Integrated Circuit), a PLD (Programmable Logic Device), an FPGA (Field Programmable Gate Array) and so on. Also, the radio base stations 10 and user terminals 20 may be implemented with a computer device that includes a processor (CPU), a communication interface for connecting with networks, a memory and a computer-readable storage medium that holds programs. That is, the radio base stations and user terminals according to an embodiment of the present invention may function as computers that execute the processes of the radio communication method of the present invention.

Here, the processor and the memory are connected with a bus for communicating information. Also, the computer-readable recording medium is a storage medium such as, for example, a flexible disk, an opto-magnetic disk, a ROM (Read Only Memory), an EPROM (Erasable Programmable ROM), a CD-ROM (Compact Disc-ROM), a RAM (Random Access Memory), a hard disk and so on. Also, the programs may be transmitted from the network through, for example, electric communication channels. Also, the radio base stations 10 and user terminals 20 may include input devices such as input keys and output devices such as displays.

The functional structures of the radio base stations 10 and user terminals 20 may be implemented with the above-described hardware, may be implemented with software modules that are executed on the processor, or may be implemented with combinations of both. The processor controls the whole of the user terminals by running an operating system. Also, the processor reads programs, software modules and data from the storage medium into the memory, and executes various types of processes.

Here, these programs have only to be programs that make a computer execute each operation that has been described with the above embodiments. For example, the control section 401 of the user terminals 20 may be stored in the memory and implemented by a control program that operates on the processor, and other functional blocks may be implemented likewise.

Also, software and commands may be transmitted and received via communication media. For example, when software is transmitted from a website, a server or other remote sources by using wired technologies such as coaxial cables, optical fiber cables, twisted-pair cables and digital subscriber lines (DSL) and/or wireless technologies such as infrared radiation, radio and microwaves, these wired technologies and/or wireless technologies are also included in the definition of communication media.

Note that the terminology used in this description and the terminology that is needed to understand this description may be replaced by other terms that convey the same or similar meanings. For example, radio resources may be specified by indices. Also, "channels" and/or "symbols" may be replaced by "signals" (or "signaling"). Also, "signals" may be "messages." Furthermore, "component carriers" (CCs) may be referred to as "carrier frequencies," "cells" and so on.

The examples/embodiments illustrated in this description may be used individually or in combinations, and may be switched depending on the implementation. Also, a report of predetermined information (for example, a report to the effect that "X holds") does not necessarily have to be sent explicitly, and can be sent implicitly (by, for example, not reporting this piece of information).

Reporting of information is by no means limited to the examples/embodiments described in this description, and other methods may be used as well. For example, reporting of information may be implemented by using physical layer signaling (for example, DCI (Downlink Control Information) and UCI (Uplink Control Information)), higher layer signaling (for example, RRC (Radio Resource Control) signaling, MAC (Medium Access Control) signaling, and broadcast information (the MIB (Master Information Block) and SIBs (System Information Blocks))), other signals or combinations of these. Also, RRC signaling may include, for example, an RRC connection setup message, RRC connection reconfiguration message, and so on.

The information, signals and/or others described in this description may be represented by using a variety of different technologies. For example, data, instructions, commands, information, signals, bits, symbols and chips, all of which may be referenced throughout the description, may be represented by voltages, currents, electromagnetic waves, magnetic fields or particles, optical fields or photons, or any combination of these.

The examples/embodiments illustrated in this description may be applied to LTE (Long Term Evolution), LTE-A (LTE-Advanced), SUPER 3G, IMT-Advanced, 4G, 5G, FRA (Future Radio Access), CDMA 2000, UMB (Ultra Mobile Broadband), IEEE 802.11 (Wi-Fi), IEEE 802.16 (WiMAX), IEEE 802.20, UWB (Ultra-WideBand), Bluetooth (registered trademark), and other adequate systems, and/or next-generation systems that are enhanced based on these.

The order of processes, sequences, flowcharts and so on that have been used to describe the examples/embodiments herein may be re-ordered as long as inconsistencies do not arise. For example, although various methods have been illustrated in this description with various components of steps in exemplary orders, the specific orders that illustrated herein are by no means limiting.

Now, although the present invention has been described in detail above, it should be obvious to a person skilled in the art that the present invention is by no means limited to the embodiments described herein. The present invention can be implemented with various corrections and in various modifications, without departing from the spirit and scope of the present invention defined by the recitations of claims. Consequently, the description herein is provided only for the purpose of explaining example s, and should by no means be construed to limit the present invention in any way.

The disclosure of Japanese Patent Application No. 2015-099522, filed on May 14, 2015, including the specification, drawings and abstract, is incorporated herein by reference in its entirety.

The invention claimed is:

1. A terminal comprising:
a processor that determines a cyclic shift to be applied to a demodulation reference signal, based on a plurality of candidates configured by higher layer signaling and based on a field, for indicating a physical uplink control channel (PUCCH) resource for an uplink control information (UCI), included in a downlink control information; and
a transmitter that transmits the UCI using a PUCCH format, in which the determined cyclic shift is applied to the demodulation reference signal and to which an orthogonal code having a sequence length less than 5 is applied,
wherein the field indicates the PUCCH resource from a set with a maximum of 8 resources,
wherein the processor controls an orthogonal cover code performed in frequency domain as the orthogonal code having the sequence length less than 5 to be applied for the PUCCH format, and
wherein a number of bits of the UCI is more than 2.

2. The terminal according to claim 1, wherein the UL control information includes at least hybrid automatic repeat request-acknowledgement (HARQ-ACK).

3. A base station comprising:
a processor, processing instructions for a transmitter to transmit, by higher layer signaling, a plurality of candidates used to determine a cyclic shift to be applied to a demodulation reference signal, and controls transmission of downlink control information including a field, for indicating a physical uplink control channel (PUCCH) resource for an uplink control information (UCI), to indicate a candidate; and
a receiver that receives the UCI that is transmitted by a terminal using a PUCCH format, in which the determined cyclic shift is applied to the demodulation reference signal and to which an orthogonal code having a sequence length less than 5 is applied,
wherein the field indicates a PUCCH resource from a set with a maximum of 8 resources,
wherein the processor controls an orthogonal cover code performed in frequency domain as the orthogonal code having the sequence length less than 5 to be applied for the PUCCH format, and
wherein a number of bits of the UCI is more than 2.

4. A terminal comprising:
a processor that:
determines a cyclic shift based on a plurality of resource candidates and a field, for indicating a physical uplink control channel (PUCCH) resource for an uplink control information (UCI), included in a downlink control information,
wherein the field indicates a PUCCH resource from a set with a maximum of 8 resources,
controls the cyclic shift to be applied to a demodulation reference signal for a PUCCH format,
controls an orthogonal code to be applied for the PUCCH format, and
controls an orthogonal cover code performed in frequency domain having a sequence length less than 5 to be applied for the PUCCH format; and
a transmitter that transmits the UCI using the PUCCH format,
wherein
the plurality of resource candidates is configured by higher layer signaling, and
a number of bits of the UCI is more than 2.

* * * * *